United States Patent
Hung et al.

(10) Patent No.: US 9,136,006 B2
(45) Date of Patent: Sep. 15, 2015

(54) METHOD AND DEVICE FOR REDUCING COUPLING NOISE DURING READ OPERATION

(71) Applicant: Macronix International Co., Ltd., Hsinchu (TW)

(72) Inventors: Shuo-Nan Hung, Jhubei (TW); Ji-Yu Hung, Jhunan Township (TW)

(73) Assignee: Macronix International Co., Ltd., Hsinchu (TW)

( * ) Notice: Subject to any disclaimer, the term of this patent is extended or adjusted under 35 U.S.C. 154(b) by 132 days.

(21) Appl. No.: 13/946,123

(22) Filed: Jul. 19, 2013

(65) Prior Publication Data

US 2014/0254260 A1    Sep. 11, 2014

Related U.S. Application Data

(60) Provisional application No. 61/775,726, filed on Mar. 11, 2013.

(51) Int. Cl.
| G11C 16/26 | (2006.01) |
| G11C 16/24 | (2006.01) |
| G11C 16/28 | (2006.01) |

(52) U.S. Cl.
CPC .............. *G11C 16/26* (2013.01); *G11C 16/24* (2013.01); *G11C 16/28* (2013.01)

(58) Field of Classification Search
CPC .......... G11C 16/02; G11C 16/24; G11C 7/12; G11C 16/3427; G11C 7/02
USPC .............. 365/185.03, 185.21, 185.25, 185.02
See application file for complete search history.

(56) References Cited

U.S. PATENT DOCUMENTS

| 7,936,586 | B2 * | 5/2011 | Hosono et al. | 365/148 |
| 8,068,362 | B2 * | 11/2011 | Ota | 365/185.03 |
| 2005/0078524 | A1 * | 4/2005 | Hosono | 365/185.22 |
| 2005/0213385 | A1 * | 9/2005 | Hosono et al. | 365/185.17 |
| 2009/0010067 | A1 * | 1/2009 | Lee | 365/185.19 |
| 2009/0103368 | A1 * | 4/2009 | Ogawa et al. | 365/185.21 |
| 2010/0046275 | A1 * | 2/2010 | Hosono et al. | 365/148 |
| 2010/0157673 | A1 * | 6/2010 | Ota | 365/185.03 |
| 2011/0075485 | A1 * | 3/2011 | Fukuda et al. | 365/185.17 |

* cited by examiner

*Primary Examiner* — Son Dinh
*Assistant Examiner* — Jerome Leboeuf
(74) *Attorney, Agent, or Firm* — Yiding Wu; Haynes Beffel & Wolfeld LLP

(57) ABSTRACT

A method is provided for sensing data in a memory device. The memory device includes a block of memory cells coupled to a plurality of bit lines. The method includes precharging the plurality of bit lines to a first level $V_{PRE}$. The method includes enabling current flow through selected memory cells on the plurality of bit lines to a reference line or to reference lines coupled to a reference voltage. The method includes preventing a voltage change as a result of the current flow on the bit lines from causing a bit line voltage to pass outside a range between the first level and a second level $V_{KEEP}$, where the second level is lower than the first level and higher than the reference voltage. The method includes sensing data in the selected memory cells.

18 Claims, 7 Drawing Sheets

METHOD AND DEVICE FOR REDUCING COUPLING NOISE DURING READ OPERATION

CROSS-REFERENCE TO RELATED APPLICATIONS

This application claims the benefit of U.S. Provisional Patent Application No. 61/775,726, filed 11 Mar. 2013.

FIELD OF THE INVENTION

The present application relates to non-volatile memory technology, and more particularly to flash memory suitable for high density implementations.

DESCRIPTION OF RELATED ART

Integrated circuit memory devices are becoming denser and faster. Groups of sense amplifiers are used for reading data from memory cells in a memory array. There can be a large number of bit lines and data lines connecting the memory cells to the groups of sense amplifiers. The bit lines can connect the memory cells to clamp circuits, while the data lines can connect the clamp circuits to charge circuits and sense amplifiers. To save layout area, the bit lines can be placed closely together, and the data lines can also be placed closely together. There is capacitance between closely placed bit lines, between closely placed data lines, and in conductive structures surrounding the bit lines and the data lines. Reading operations on memory cells in a NAND flash memory includes charging and discharging the capacitance associated with the bit lines and data lines coupled to the memory cells using electrical current through the memory cells. Coupling noise experienced by a bit line or a data line can depend on the switching behavior of neighboring bit lines or data lines.

It is desirable to reduce coupling noise on bit lines and data lines during read operations.

SUMMARY

A method is provided for sensing data in a memory device. The memory device includes a block of memory cells coupled to a plurality of bit lines. The method includes precharging the plurality of bit lines to a first level $V_{PRE}$. The method includes enabling current flow through selected memory cells on the plurality of bit lines to a reference line or to reference lines coupled to a reference voltage. The method includes preventing a voltage change as a result of the current flow on the bit lines from causing a bit line voltage to pass outside a range between the first level and a second level $V_{KEEP}$, where the second level is lower than the first level and higher than the reference voltage. The method includes sensing data in the selected memory cells.

Other aspects and advantages of the present invention can be seen on review of the drawings, the detailed description and the claims, which follow.

DETAILED DESCRIPTION

A detailed description of embodiments of the present invention is provided with reference to the Figures. Embodiments are described to illustrate the present invention, not to limit its scope, which is defined by the claims. Those of ordinary skill in the art will recognize a variety of equivalent variations on the description that follows.

Figure 1:
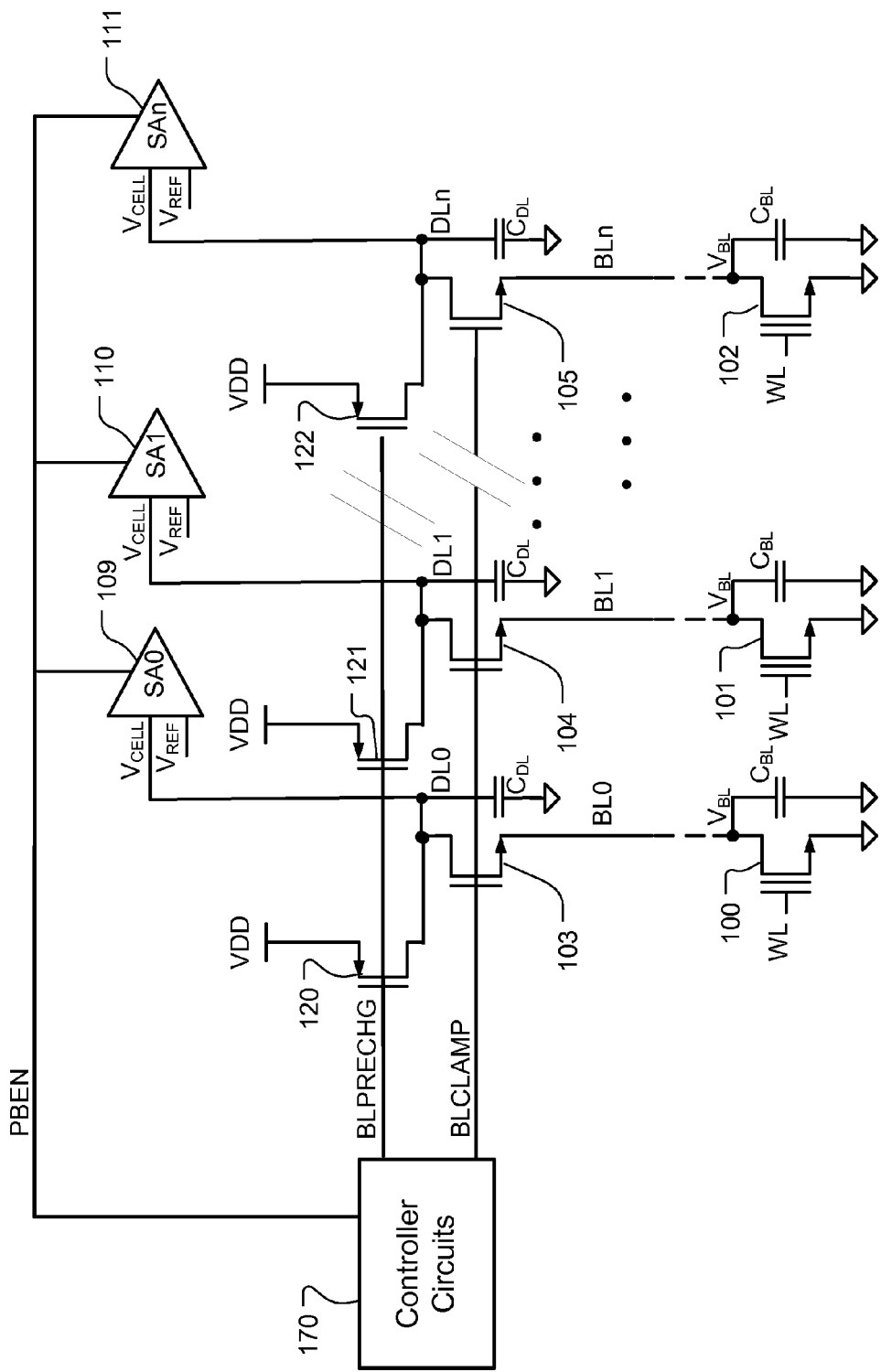
FIG. 1 illustrates a memory device including bit lines coupled to memory cells and clamp circuits, and data lines coupled to clamp circuits, charge circuits, and sense amplifiers.

FIG. 1 illustrates a memory device including bit lines coupled to memory cells and clamp circuits, and data lines, which act as sensing nodes in this example, coupled to clamp circuits, charge circuits, and sense amplifiers. The memory device includes a block of memory cells, including a plurality of columns and rows. The memory device includes a plurality of bit lines coupled to columns in the block, and a plurality of word lines coupled to rows in the block. The memory device includes a reference line or lines coupled to the plurality of bit lines in the block. The memory device includes charge circuits to apply a precharge voltage to sensing nodes in response to a control signal. The memory device includes clamp circuits, between the sensing nodes and the bit lines in the plurality of bit lines, where the clamp circuits are responsive to clamp voltages. The memory device includes a controller to apply wordline voltages for a read operation to the word lines, and sense amplifiers coupled to the sensing nodes. The memory device includes circuits to provide the wordline voltages, the control signal and the clamp voltages.

The memory cells are represented by memory cells 100-102, found on respective columns along the bit lines in the block of memory cells, wherein the voltages $V_{BL}$ are coupled to selected bit lines BL0, BL1, . . . , BLn. The bit lines BL0, BL1, . . . , BLn are coupled at corresponding data lines DL0, DL1, . . . , DLn configured as sensing nodes, to sense amplifiers SA0, SA1, . . . SAn in a page buffer that includes, in the illustrated example, charge circuits 120-122, clamp circuits 103-105, and the sense amplifiers SA0, SA1, . . . SAn, as explained in more detail below. In the illustrated embodiment, there are n+1 bit lines BL0, BL1, . . . , BLn and n+1 data lines DL0, DL1, . . . , DLn in the array of memory cells.

Capacitance $C_{BL}$ is associated with each of the bit lines. The capacitance $C_{BL}$ represents the total bit line capacitance for access to a selected cell. Capacitance $C_{DL}$ is associated with each of the data lines. The capacitance $C_{DL}$ represents the total data line capacitance for access to a selected cell.

Clamp circuits 103-105 are coupled between respective bit lines BL0, BL1, . . . , BLn and data lines DL0-DLn, and arranged identically in the illustrated embodiment. A clamp circuit 103 includes a clamp transistor on bit line BL0. In this embodiment, the clamp circuit 103 is an n-channel MOS transistor in a cascode configuration with a source coupled to a conductor which is in turn coupled via decoding circuitry to the selected memory cell, with a drain coupled to a data line DL0 acting as a sensing node, and a gate coupled to a clamp signal BLCLAMP. As illustrated, the clamp circuits 103-105 have their gates coupled to the clamp signal BLCLAMP at an output of the controller circuits 170, which apply a bias voltage on the clamp signal BLCLAMP.

Charge circuits 120-122 are coupled to respective data lines DL0, DL1, . . . DLn. The charge circuit 120 includes a n-channel MOS transistor with its source coupled to the supply potential $V_{DD}$, its drain coupled to the data line DL0, and a gate coupled to a control signal BLPRECHG. As illustrated, the charge circuits 120-122 have their gates coupled to the control signal BLPRECHG at an output of the controller circuits 170, which apply a bias voltage on the control signal BLPRECHG.

Clamp circuit 104, and charge circuit 121 on data line DL1 are arranged in the same way. Likewise, clamp circuit 105, and charge circuit 122 on data line DLn are arranged in the same way.

The data line DL0 is coupled to sense amplifier 109. Likewise, the data line DL1 is coupled to sense amplifier 110. The data line DLn is coupled to sense amplifier 111. Each of the sense amplifiers 109-111 in this example includes a second input coupled to a reference voltage $V_{REF}$. The sense amplifiers 109-111 provide output data which indicates the data stored in the respective selected memory cells 100-102. The reference voltage $V_{REF}$ can be produced using a dummy reference memory cell, or otherwise. In other embodiments, the sense amplifiers may be part of a page buffer.

In FIG. 1, the control signal BLPRECHG, the clamp signal BLCLAMP, and a latch signal PBEN are coupled to the controller circuits 170 for controlling the timing of read operations which includes a precharge interval and a sensing interval. Signals BLPRECHG and PBEN are coupled to the charge circuits 120-122 and the sense amplifiers 109-111, respectively, to control the timing of application of a precharge voltage to the data lines, and the timing at which the sense amplifiers sense the data on the sensing nodes. Typically, the control signal BLPRECHG is applied first to precharge the sensing nodes on the data lines, while the controller circuits 170 produce a bias voltage on the clamp signal BLCLAMP to prevent the sensing nodes from overshooting a target level. At the end of the precharge interval, the control signals BLPRECHG is used to turn off the charge circuits 120-122, and the latch signal PBEN is asserted with appropriate timing so that the voltage $V_{CELL}$ on the sensing nodes reflects the data value in the selected memory cells.

A bias voltage is applied to the clamp signal BLCLAMP on the gates of the clamp circuits 103-105 on the data lines DL0-DLn in the array, at different voltage levels for different timing intervals of the read operations. Similarly, a voltage is applied to the control signal BLPRECHG on the gates of the charge circuits 120-122 on the data lines DL0-DLn in the array, at different voltage levels for different timing intervals of the read operations.

Figure 2:
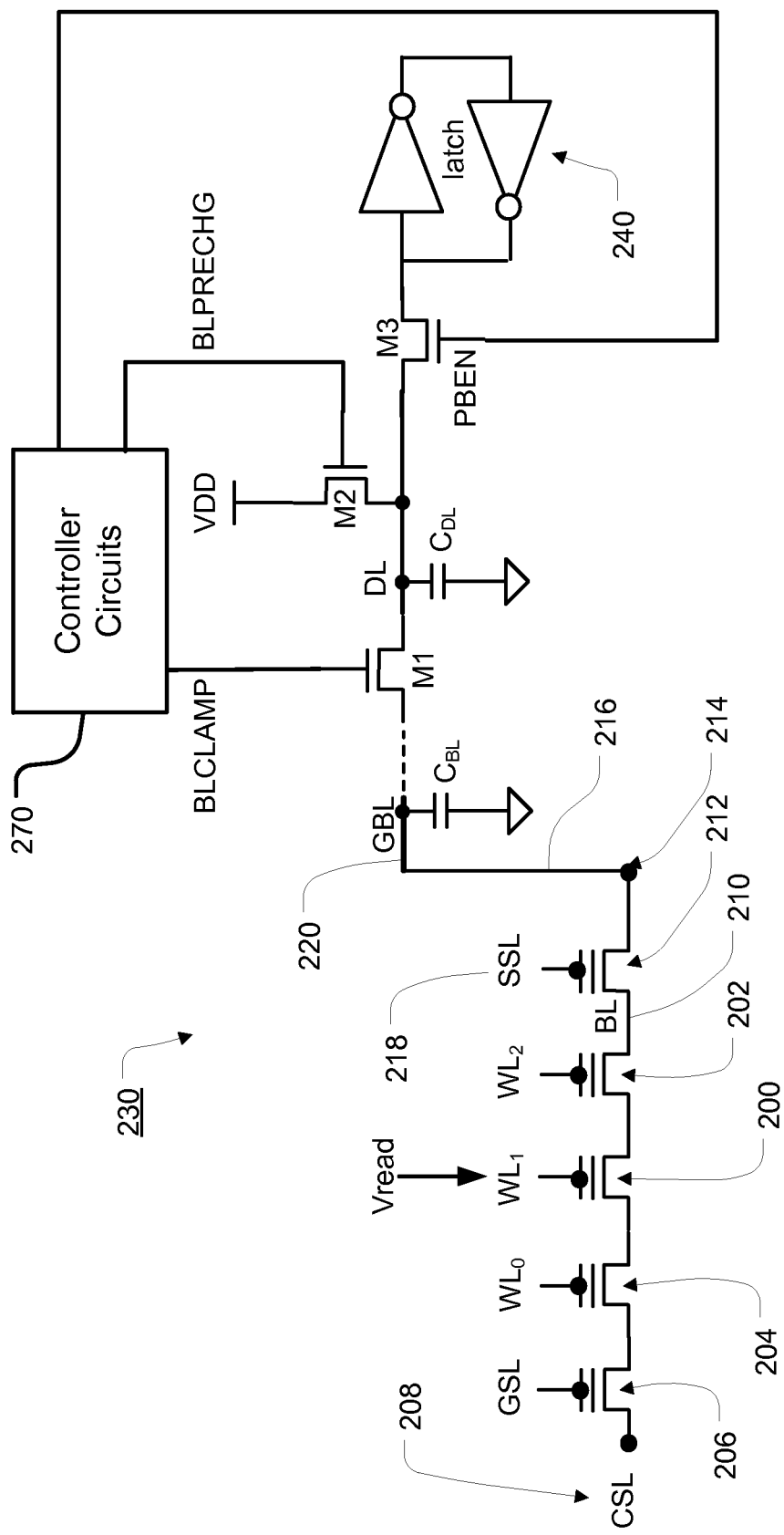
FIG. 2 is a schematic diagram of a circuit suitable for use in performing a read operation on a selected memory cell.

FIG. 2 is a schematic diagram of a circuit suitable for use in performing a read operation on a selected memory cell 200. The selected memory cell 200 is part of a NAND string formed by local bit line BL 210 in a block of memory cells. The NAND string also includes memory cell 202 and memory cell 204. String select transistor 212 selectively couples the bit line 210 to the global bit line 220 via contact pad 214 and vertical connector 216 at one end of the NAND string. The gate of the string select transistor 212 is connected to string select line SSL 218. Ground select line (GSL) switch 206 selectively couples a second end of the NAND string to common source line CSL 208. The selected memory cell 200 includes a drain terminal (D) coupled to the local bit line BL 210, a source terminal (S) coupled to a reference line (e.g. the common source line CSL 208), and a gate terminal coupled to a word line WL1.

The global bit line 220 is coupled by column decoder circuitry (not shown) to sensing circuitry 230 in a page buffer for the global bit line 220. The page buffer can include a charge circuit M2, a clamp circuit M1, and a latch based sense amplifier 240, coupled to a sensing node at the data line DL. Signals BLCLAMP, BLPRECHG and PBEN are coupled to the page buffer, and are provided by control circuits 270 to control the timing and performance of a read operation that includes a precharge interval and a sensing internal.

The charge circuit M2 has a first terminal connected to the data line DL, a second terminal coupled to a power supply voltage (e.g. $V_{DD}$), and a gate coupled to signal BLPRECHG. Controller circuits 270 apply the BLPRECHG signal at a voltage level and timing that depend on the control sequence being executed.

The clamp circuits M1 is coupled between the global bit line 220 and data line DL. Clamp signal BLCLAMP is connected to the gate of the clamp circuit M1. Controller circuits 270 apply the clamp signal BLCLAMP at a voltage level and timing that depend on the control sequence being executed.

An enable transistor M3 is arranged between the data line DL and the latch based sense amplifier 240. The latch signal PBEN is connected to the gate of the enable transistor M3. Controller circuits 270 apply the latch signal PBEN at a voltage level and timing that depend on the control sequence being executed to sense voltages on the sensing node at data line DL.

The charge circuit M2 can apply a power supply voltage $V_{DD}$ to the sensing node at the data line DL in response to the signal BLPRECHG to enable sensing of a selected memory cell (e.g. 200). The clamp circuit M1 is between the sensing node at data line DL and the bit line BL. The clamp circuit M1 limits voltage swing on the bit line BL based on the voltage of the clamp signal BLCLAMP applied on a gate of the clamp circuit M1. The memory device includes circuits to apply word line voltages $V_{READ}$ for a read operation on a gate of the selected memory cell 200. The circuits that apply $V_{READ}$ are referred to as WL drivers. The WL drivers enable current flow on the bit line BL through the selected memory cell 200, when the GSL switch 206 is on. Capacitance $C_{BL}$ represents the total bit line capacitance surrounding the bit line BL for access to the selected memory cell. Capacitance $C_{DL}$ represents the total data line capacitance surrounding the data line DL for access to the selected memory cell.

Figure 3:
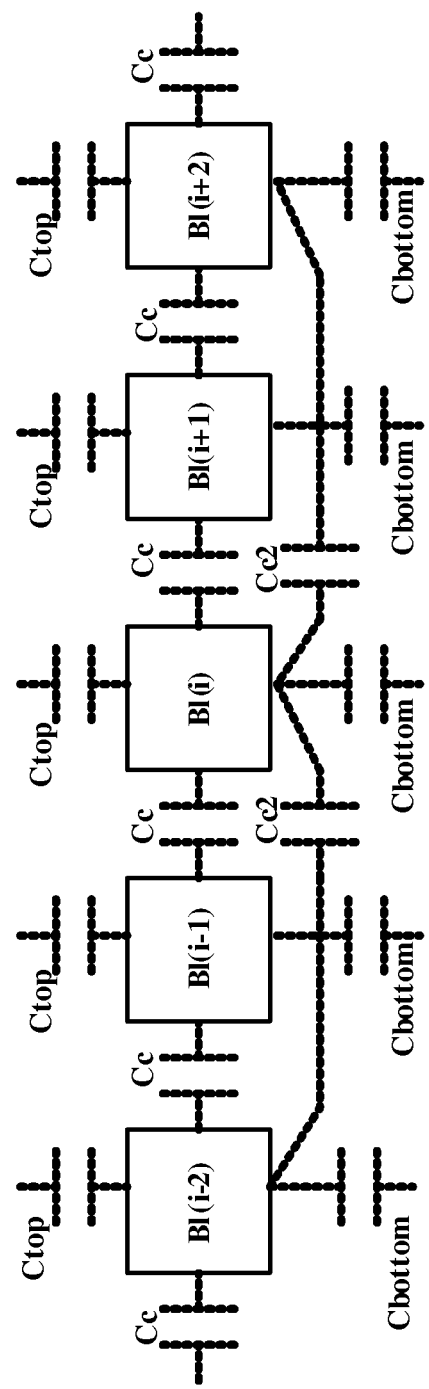
FIG. 3 is a schematic diagram illustrating the capacitance associated with bit lines.

FIG. 3 is a schematic diagram illustrating the capacitance associated with bit lines, such as the capacitance $C_{BL}$ representing the total bit line capacitance associated with each of the bit lines as illustrated in FIG. 1. As illustrated in FIG. 3, there is capacitance between closely placed bit lines (e.g. Cc and Cc2), and in conductive structures surrounding the bit lines (e.g. Ctop and Cbottom). Much of the bit line capacitance associated with a bit line (e.g. Bl(i)) can be from the capacitance between two neighboring bit lines, such as Cc between bit lines Bl(i−2) and Bl(i−1), Cc between bit lines Bl(i−1) and Bl(i), Cc between bit lines Bl(i) and Bl(i+1), and Cc between bit lines Bl(i+1) and Bl(i+2). Capacitance Cc2 between two bit lines (e.g. Bl(i−2) and Bl(i)) with an intervening bit line (e.g. Bl(i−1)) can also contribute to the total bit line capacitance experienced by one of the two bit lines (e.g. Bl(i−2) or Bl(i)). Likewise, capacitance Cc2 between two bit lines (e.g. Bl(i) and Bl(i+2)) with an intervening bit line (e.g. Bl(i+1)) can contribute to the total bit line capacitance experienced by one of the two bit lines (e.g. Bl(i) or Bl(i+2)).

Coupling noise experienced by a bit line due to the associated capacitance can depend on the switching behavior of neighboring bit lines, particularly in dense memory circuits. The capacitance problem can occur to bit line structures between memory cells and clamp circuits, as well as to data line structures between clamp circuits and sense amplifiers.

Figure 4:
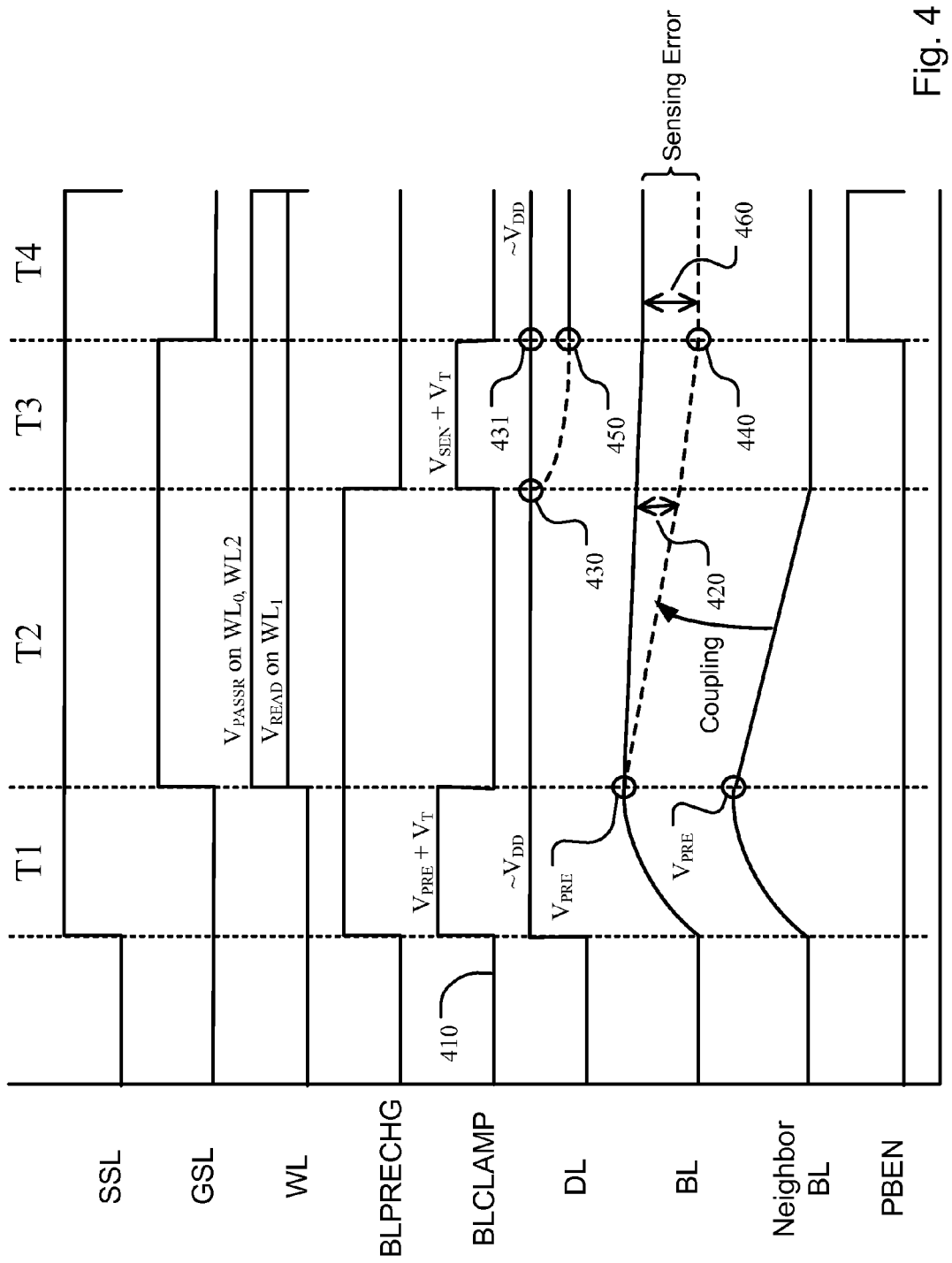
FIG. 4 is an example timing diagram illustrating the coupling noise during read operations arising from the coupling capacitance.

FIG. 4 is an example timing diagram illustrating the coupling noise during read operations arising from the coupling capacitance. During a read operation, control signals can be arranged in a sequence to control the biasing circuits, word lines, and other circuits in the memory device, as shown in FIG. 4. For instance, signals BLCLAMP, BLPRECHG and PBEN can be applied to control the timing and voltage levels of the read operation.

During a first interval T1, the control signal BLPRECHG is set to a voltage level sufficient to turn on the charge circuit M2 (FIG. 2), and the clamp signal BLCLAMP is set to a voltage level (e.g. $V_{PRE}+V_T$) higher than a precharge level $V_{PRE}$, relative to a reference voltage 410, to turn on the clamp circuit M1 (FIG. 2) and to precharge the bit line BL to the voltage level $V_{PRE}$. For instance, the clamp signal BLCLAMP can be set to a voltage level higher than the precharge level $V_{PRE}$ by the amount of a threshold voltage $V_T$ of the clamp circuit M1 (FIG. 2). The data line DL is precharged to about the power supply voltage $V_{DD}$, using the charge circuit M2. The string select line (SSL) 218 is charged to a high value to turn on the string select line switch (SSL switch) 212. The ground select line GSL is set to a low value to turn off the GSL switch 206. As a result, during the first interval T1, the selected local bit line BL 210 is precharged to the precharge level $V_{PRE}$, using the charge circuit M2 via the clamp circuit M1. Meanwhile, one or more neighbor bit lines (Neighbor BL) can also be precharged to the precharge level $V_{PRE}$, using charge circuits and clamp circuits coupled to the one or more neighbor bit lines.

During a second interval T2, the word lines $WL_0$ and $WL_2$ (and other word lines in the string), coupled to the gates of the unselected memory cells 202 and 204, are charged to a voltage value $V_{PASSR}$ sufficient to turn on the unselected memory cells 202 and 204, even if they are in a high threshold state. The word line $WL_1$ coupled to the gate of the selected memory cell 200 is charged to a voltage value $V_{READ}$. $V_{READ}$ is sufficient to turn on the selected memory cell 200 if in the low threshold, and insufficient to turn on the selected memory cell 200 if in the high threshold state (for a one bit cell). The GSL switch 206 is turned on connecting the string to a reference voltage such as ground on the source side of the string, and the SSL switch 212 remains on.

Wordline voltages for a read operation (e.g. $V_{READ}$) are applied via the word line $WL_1$ on the selected memory cell 200, to enable current flow on the bit line BL 210 during the second interval T2, causing the voltage on the data line to fall toward the source side reference voltage at a rate that depends on the threshold of the selected cell 200.

A low voltage value, such as reference voltage 410 which can be at 0V, is applied via the clamp signal BLCLAMP on the gate of the clamp circuit M1 to turn off the clamp circuit. The control signal BLPRECHG remains at the same voltage level as during the first interval T1 to keep the charge circuit M2 on, and to keep the data line DL at about the power supply voltage $V_{DD}$. Current through the selected memory cell 200 starts to discharge the bit line BL (e.g. 210 in FIG. 2) in the second interval T2, while the gate of the selected memory cell 200 is biased at the voltage value $V_{READ}$ via a word line WL (e.g. $WL_1$ in FIG. 2).

If the selected memory cell (e.g. 200 in FIG. 2) on a particular bit line BL (e.g. 210 in FIG. 2) is a high threshold voltage cell, and if selected memory cells on adjacent or near neighbor bit lines (Neighbor BL) are high threshold memory cells, then current through the selected memory cell discharges the particular bit line from the precharge level $V_{PRE}$ at a relatively slow rate, as indicated by the solid curve for the bit line BL in the second interval T2.

If selected memory cells on adjacent or near neighbor bit lines (Neighbor BL) are low threshold memory cells, then the neighbor bit lines can be discharged to a low voltage value, such as near a ground voltage level or 0V. Consequently, the voltage swings between the precharge level $V_{PRE}$ and the low voltage value on the adjacent or near neighbor bit lines can be capacitively coupled to the particular bit line BL (e.g. 210 in FIG. 2), causing a higher discharging rate on the bit line BL, as indicated by the dotted curve for the bit line BL in the second interval T2, and in turn a voltage drop 420 on the bit line BL due to the coupling capacitance. The voltage drop 420 can lead to sensing errors for high threshold memory cells.

During a third interval T3, the control signal BLPRECHG is set to a low value to turn off the charge circuit M2 (FIG. 2), leaving the data line precharged to about the supply voltage VDD (430). Also, a voltage level (e.g. $V_{SEN}+V_T$) higher than a sensing level $V_{SEN}$ is applied to the clamp signal BLCLAMP to bias the clamp circuit M1 at $V_{SEN}+V_T$. The sensing level $V_{SEN}$ is lower than the precharge level $V_{PRE}$. At this point, if the bit line BL is at a voltage higher than $V_{SEN}$, then the clamp circuit M1 will remain off and the data line DL will remain at the precharged level (430-431). If the bit line BL has discharged such that the voltage at the bit line BL is lower than $V_{SEN}$ because the selected cell is in a low threshold state, then the data line DL is discharged to the bit line BL, and a relatively low voltage at the bit line BL, such as between 0V and $V_{SEN}$, is then transferred to the data line DL.

The higher discharging rate on the bit line BL due to coupling capacitance, as indicated by the dotted curve for the bit line BL in the second interval T2, can continue into the third interval, and result at a low voltage level 440 on the bit line BL, at the end of the third interval T3. The low voltage level 440 can then be transferred to a low voltage level 450 on the data line DL, at the end of the third interval T3. The voltage drop 420 due to coupling capacitance during the second interval T2 can increase to a voltage drop 460 during the third interval T3.

During a fourth interval T4, the enable transistor M3 (FIG. 2) is turned on by the latch signal PBEN, while the ground select line GSL is set to a low value to turn off the GSL switch 206, and the clamp signal BLCLAMP is set to a low value to block the current flow on the bit line (e.g. 210), such that the latch-based sense amplifier 240 (or page buffer) can sense whether voltages on the sensing nodes are above or below a trip point near the sensing level $V_{SEN}$ while the current flow is blocked on the bit line. However, the voltage drop 460 for high threshold memory cells due to coupling capacitance can cause sensing errors for sensing by sense amplifiers (or page buffer) (e.g. 240).

Figure 5:
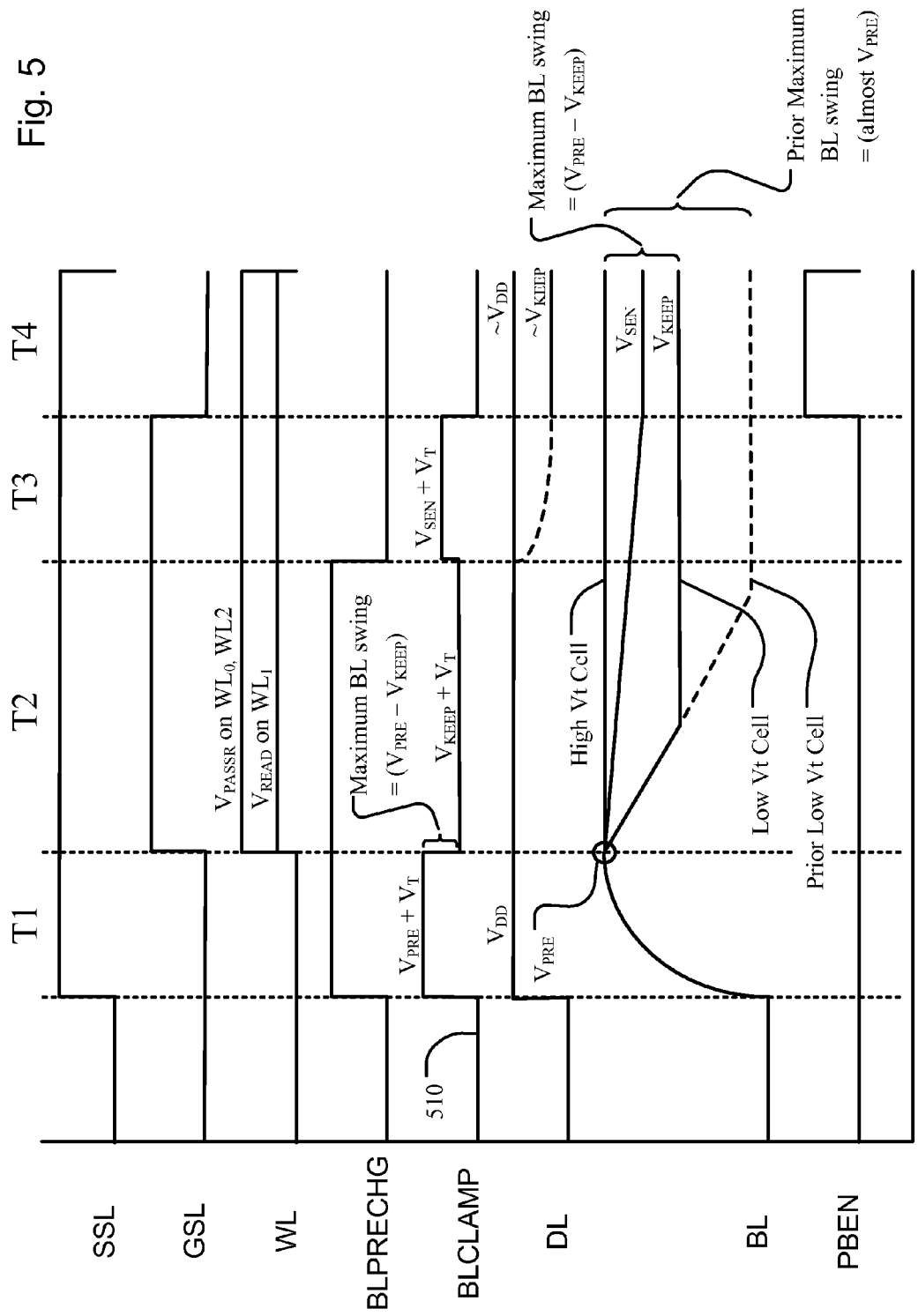
FIG. 5 is an example timing diagram for operating the memory device illustrated in FIG. 2 to reduce coupling noise during read operations.

FIG. 5 is an example timing diagram for operating the memory device illustrated in FIG. 2 to reduce coupling noise during read operations. The controller circuits 270 on the memory device are arranged to cause a sequence during a read operation by controlling the biasing circuits, word lines, and other circuits in the memory device, as shown in FIG. 5.

Upon initiating a read operation, signals BLCLAMP, BLPRECHG and PBEN are applied to control the timing and voltage levels of the read operation.

During a first interval T1, the control signal BLPRECHG is set to a voltage level sufficient to turn on the charge circuit M2 (FIG. 2), and the clamp signal BLCLAMP is set to a voltage level (e.g. $V_{PRE}+V_T$) higher than a first level $V_{PRE}$, relative to a reference voltage 510, to turn on the clamp circuit M1 (FIG. 2) and to precharge the bit line BL to the voltage level $V_{PRE}$. For instance, the clamp signal BLCLAMP can be set to a voltage level higher than the first level $V_{PRE}$ by the amount of a threshold voltage $V_T$ of the clamp circuit M1 (FIG. 2). The data line DL is precharged to about the power supply voltage $V_{DD}$, using the charge circuit M2. The string select line (SSL) 218 is charged to a high value to turn on the string select line switch (SSL switch) 212. The ground select line GSL is set to a low value to turn off the GSL switch 206. As a result, during the first interval T1, the selected local bit line BL 210 is precharged to the first level $V_{PRE}$, using the charge circuit M2 via the clamp circuit M1.

During a second interval T2, the word lines $WL_0$ and $WL_2$ (and other word lines in the string), coupled to the gates of the unselected memory cells 202 and 204, are charged to a voltage value $V_{PASSR}$ sufficient to turn on the unselected memory cells 202 and 204, even if they are in a high threshold state. The word line $WL_1$ coupled to the gate of the selected memory cell 200 is charged to a voltage value $V_{READ}$. $V_{READ}$ is sufficient to turn on the selected memory cell 200 if in the low threshold, and insufficient to turn on the selected memory cell 200 if in the high threshold state (for a one bit cell). The GSL switch 206 is turned on connecting the string to a reference voltage such as ground on the source side of the string, and the SSL switch 212 remains on.

Wordline voltages for a read operation (e.g. $V_{READ}$) are applied via word lines (e.g. $WL_1$) on selected memory cells (e.g. 200, FIG. 2), to enable current flow on the bit lines BL (e.g. 210) during the second interval T2, such that current through the memory cells discharges the bit lines at rates that depend on the thresholds of the selected memory cells (e.g. 200). A voltage level (e.g. $V_{KEEP}+V_T$) higher than a second level $V_{KEEP}$ is applied via the clamp signal BLCLAMP on the gate of the clamp circuit M1, to prevent the bit lines from discharging below the second level $V_{KEEP}$ via the clamp circuit M1. The second level $V_{KEEP}$ is lower than the first level $V_{PRE}$ and higher than the source side reference voltage, which may be the same as reference voltage 510. For instance, the clamp signal BLCLAMP can be set to a voltage level higher than the second level $V_{KEEP}$ by the amount of the threshold voltage $V_T$ of the clamp circuit M1 (FIG. 2). The bit lines (e.g. 210, FIG. 2) are thus prevented from discharging below the second level $V_{KEEP}$ via the clamp circuit M1.

If the selected memory cell 200 is a high Vt (threshold voltage) cell, current through the selected memory cell 200 discharges the bit line 210 from the first level $V_{PRE}$ at a relatively slow rate. If the threshold voltage is high enough, the current through the selected memory cell 200 may be small enough that the voltage on the bit line remains at about the first level $V_{PRE}$ at the end of the second interval T2. If the selected memory cell 200 is a low Vt (threshold voltage) cell, current through the selected memory cell 200 discharges the bit line 210 from the first level $V_{PRE}$ to the second level $V_{KEEP}$ at a relatively fast rate, and may reach $V_{KEEP}$ at the end of the second interval.

A selected memory cell may have a threshold voltage between or at the margins of a distribution for the high threshold state and a distribution for the low threshold state for memory cells in the memory device. Current through the selected memory cell discharges a bit line from the first level $V_{PRE}$ towards a third level $V_{SEN}$ at a rate between the relatively slow rate for a high Vt cell and the relatively fast rate for a low Vt cell. The third level $V_{SEN}$ is set in embodiment of the technology based on the margin of the threshold state, so that cells having thresholds at the margin of the high threshold state discharge the bit line to a level at least as high as the third level $V_{SEN}$.

During a third interval T3, the control signal BLPRECHG is set to a low value to turn off the charge circuit M2 (FIG. 2), leaving the data line precharged to about the supply voltage VDD. A voltage level (e.g. $V_{SEN}+V_T$) higher than the third level $V_{SEN}$ is applied to the clamp signal BLCLAMP, to block current flow to the sensing nodes from the bit lines that have voltage above the third level $V_{SEN}$, and to pass current from the bit lines that have a voltage level below the third level $V_{SEN}$ to the sensing nodes. At this point, if the bit line BL remains between about $V_{PRE}$ and $V_{SEN}$, then the clamp transistors M1 will remain off. If the bit line has discharged because the selected cell is in a low threshold state, then the voltage about $V_{KEEP}$ will be transferred to the data line DL. For instance, the clamp signal BLCLAMP can be applied to a voltage level higher than the third level $V_{SEN}$ by the amount of the threshold voltage $V_T$ of the clamp circuit M1 (FIG. 2). The third level $V_{SEN}$ is lower than the first level $V_{PRE}$ and higher than the second level $V_{KEEP}$.

If the selected memory cell 200 is a high Vt cell, the bit line 210 is likely not discharged from the first level $V_{PRE}$ during the second interval T2, and the data line DL can remain at the same voltage level in the third interval T3 as in the second interval T2. If the selected memory cell 200 is a low Vt cell, the bit line 210 is likely discharged from the first level $V_{PRE}$ to the second level $V_{KEEP}$ during the second interval T2, and the current through the clamp circuit M1 discharges the data line DL to about the second level $V_{KEEP}$, as indicated by the dotted line in the third interval for the data line DL.

During a fourth interval T4, the enable transistor M3 (FIG. 2) is turned on by the latch signal PBEN, while the ground select line GSL is set to a low value to turn off the GSL switch 206, and the clamp signal BLCLAMP is set to a low value to block the current flow on the bit line (e.g. 210), such that the latch-based sense amplifier 240 (or page buffer) can sense whether voltages on the sensing nodes are above or below a trip point near the third level $V_{SEN}$ while the current flow is blocked on the bit lines. The threshold or trip point for the sense amplifier can be set to a value near $V_{SEN}$.

In the present technology, the maximum voltage swing on the bit line BL (e.g. 210) is $(V_{PRE}-V_{KEEP})$, i.e., the difference between the first level $V_{PRE}$ for high Vt cells and the second level $V_{KEEP}$ for low Vt cells. Whereas in a prior art, where current through a selected memory cell with low Vt can discharge the bit line to a voltage level as low as 0V (i.e. near the source side reference voltage) as shown by the dotted line for BL in the second interval T2, the third interval T3 and the fourth interval T4, the maximum voltage swing for the prior art on the bit line can be almost $V_{PRE}$, i.e., the voltage to which the bit line is charged in the first interval.

During sensing, if the selected cell on a particular bit line is a high threshold cell, while the selected cell on an adjacent or near neighbor bit line, or on more than one of the adjacent and near neighbor bit lines is in a low threshold state, then the voltage swings on the adjacent and near neighbor bit lines will be capacitively coupled to the particular bit line. The coupling noise can cause false readings, or reduce margins. As described herein, the coupling noise on bit lines and data lines during read operations can be reduced by the reduction in the maximum voltage swing on the bit line from almost $V_{PRE}$ to $(V_{PRE}-V_{KEEP})$.

In reference to FIGS. 2 and 5, below is a table showing example values for voltage levels described herein. As described herein, the third level $V_{SEN}$ is lower than the first level $V_{PRE}$ and higher than the second level $V_{KEEP}$. As illustrated in the table, $V_{KEEP}$ can be 0.5V so the maximum voltage swing can be reduced by about 0.5V.

| | |
|---|---|
| $V_{DD}$ | 2 V |
| $V_{PRE}$ | 0.8 V-1 V |
| $V_{KEEP}$ | 0.5 V |
| $V_{SEN}$ | 0.6 V |
| $V_T$ | 0.5 V |

Figure 6:
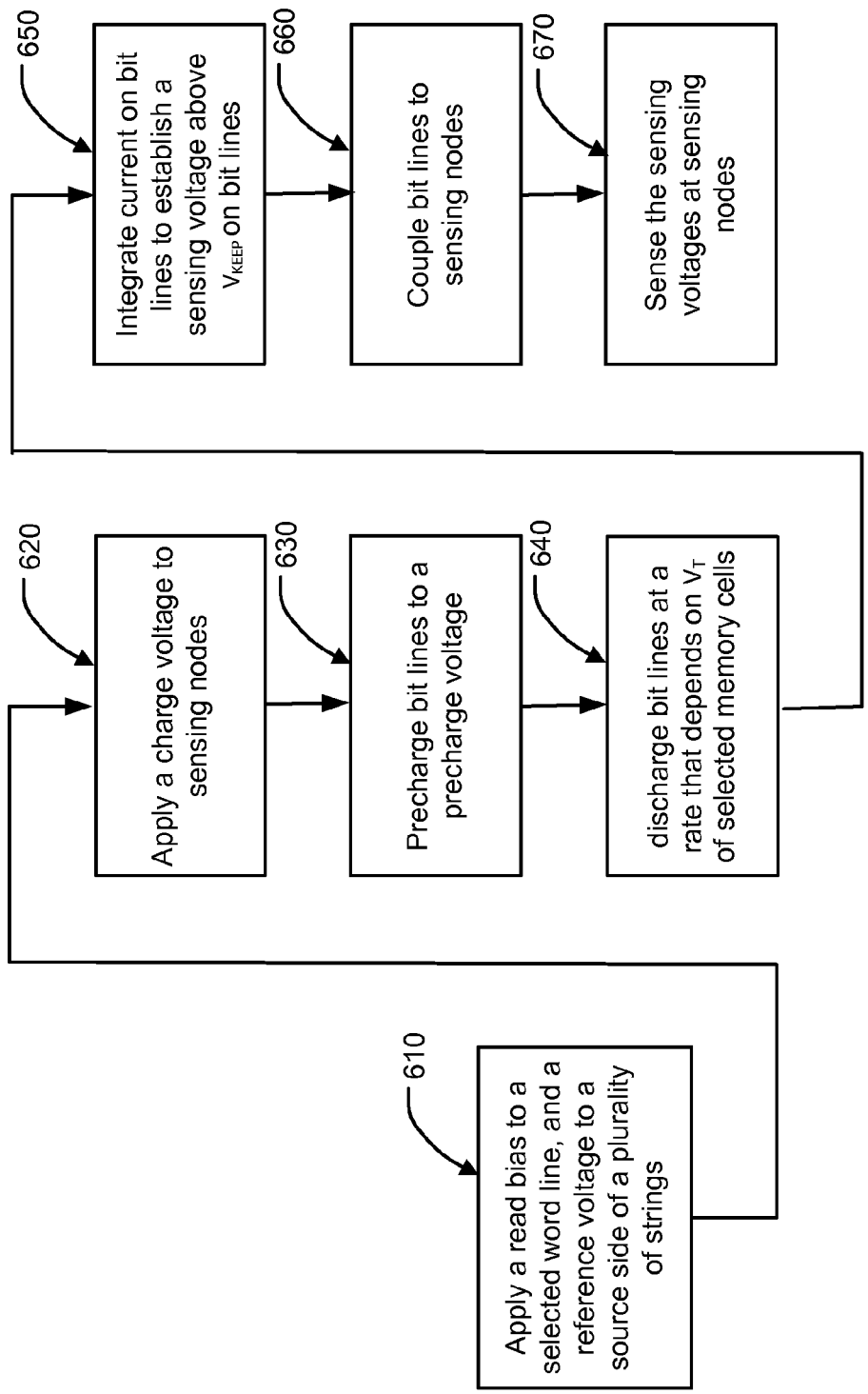
FIG. 6 is a flowchart of an operational sequence for sensing data in a NAND flash memory device.

FIG. 6 is a flowchart of an operational sequence for sensing data in a NAND flash memory device. The memory device includes a block of memory cells that has a plurality of NAND strings coupled between bit lines and reference lines. For example, a NAND string of at least memory cells 204, 200 and 202 is coupled between a bit line BL 210 and a reference line CSL 208, as illustrated in FIG. 2.

At step 610, a read bias (e.g. $V_{READ}$) is applied to a selected word line (e.g. $WL_1$), and a reference voltage (e.g. GSL) is applied to a source side of the plurality of NAND strings, as illustrated in FIGS. 2 and 6.

At step 620, a charge voltage (e.g. $V_{DD}$, FIG. 5) is applied to sensing nodes at data lines DL via current flow through charge circuits (e.g. M2, FIG. 2). At step 630, bit lines are precharged to a precharge level (e.g. $V_{PRE}$, FIG. 5) via current flow through bit line clamp transistors (e.g. M1, FIG. 2). At step 640, bit lines are discharged at a rate that depends on threshold voltages of memory cells on the selected word line (e.g. $WL_1$, FIG. 2). For instance, bit lines are discharged at a relatively slow rate for a selected high threshold memory cell as indicated by the solid curve for BL, while bit lines are discharged at a relatively fast rate for a selected low threshold memory cell as indicated by the dotted curve for BL, as illustrated in the second interval T2 in FIG. 5.

At step 650, current is integrated on bit lines to establish a sensing voltage on bit lines (e.g. 210, FIG. 2), while the sensing voltage is limited to a range above a minimum level ($V_{KEEP}$), where the minimum level ($V_{KEEP}$) is greater than the reference voltage. The sensing voltage is limited by clamping the bit lines using bit line clamp transistors (e.g. M1, FIG. 2) between the bit lines and the sensing nodes set for clamping at the minimum level ($V_{KEEP}$). Thus current flow is blocked between the bit lines and the sensing nodes if the sensing voltage is above the minimum level, and current flow is enabled between the bit lines and the sensing nodes if the sensing voltage is below the minimum level.

At step 660, bit lines are coupled to the sensing nodes using the bit line clamp transistors (e.g. M1, FIG. 2) set to block current flow if the sensing voltage on the bit line is above a sensing level ($V_{SEN}$) and to pass current to the sensing node if the sensing voltage is below the sensing level. At step 670, the sensing voltages on the sensing nodes are sensed by sense amplifiers (e.g. 240, FIG. 2), where the sensing voltages on the sensing nodes are higher than the reference voltage.

Figure 7:
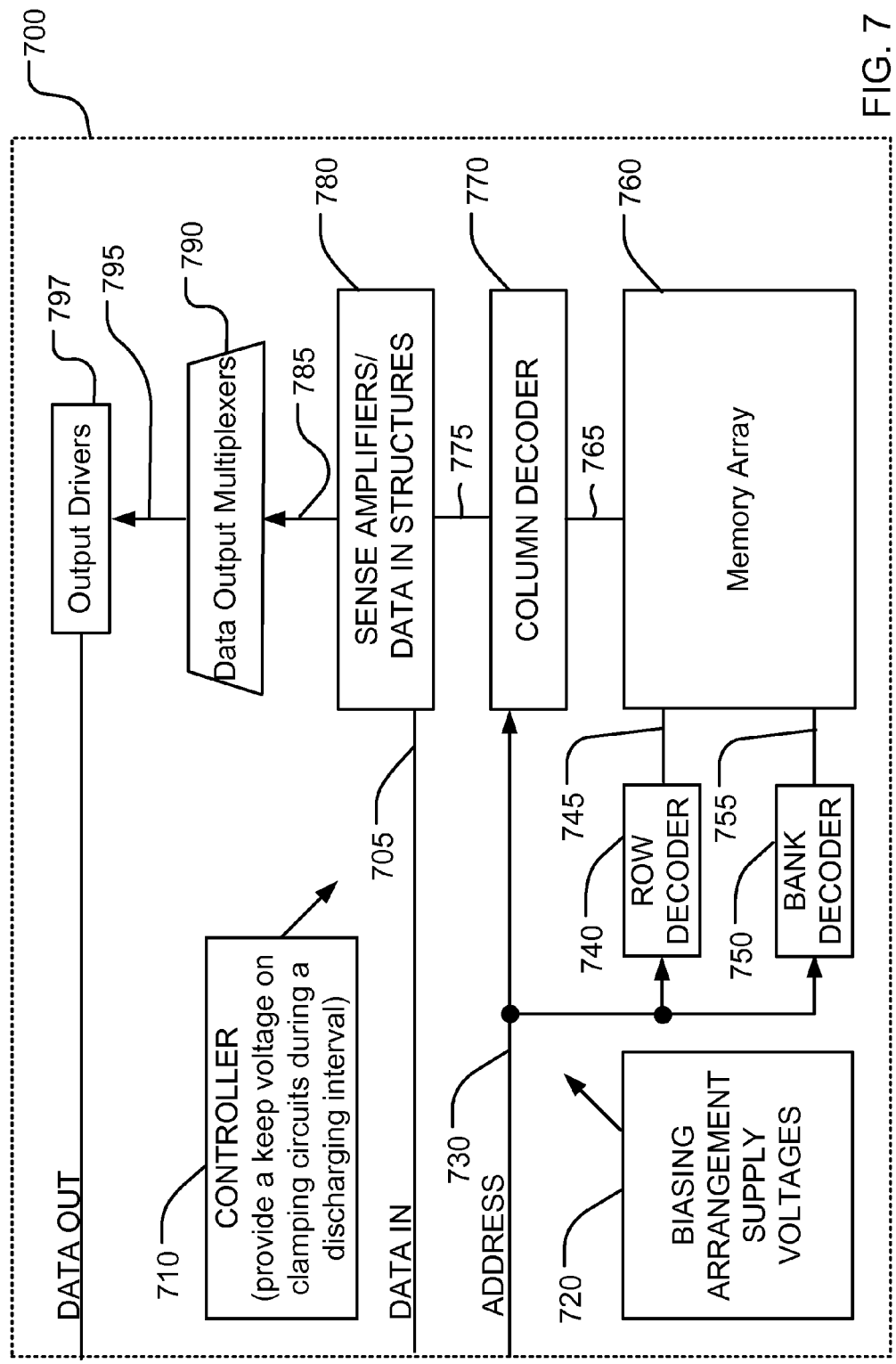
FIG. 7 is a simplified block diagram of a memory device according to an embodiment.

FIG. 7 is a simplified block diagram of a memory device according to an embodiment. The memory device 700 includes a memory array 760 on an integrated circuit substrate. The memory array 760 includes a block of memory cells, including a plurality of NAND strings of memory cells. A row decoder 740 is coupled to a plurality of word lines 845, and arranged along rows in the memory array 700. A column decoder 770 is coupled to a plurality of bit lines 765 arranged along columns in the memory array 760 for reading and programming data from the memory cells in the array 760. A bank decoder 750 is coupled to a plurality of banks in the memory array 760 on bus 755. Addresses are supplied on bus 730 to column decoder 770, row decoder 740 and bank decoder 750. Sense amplifiers and data-in structures in block 780 are coupled to the column decoder 770 in this example via data bus 775. Sense amplifiers in block 780 are configured to sense whether the sensing nodes are above or below a trip point near the third level (e.g. $V_{SEN}$, FIG. 5). Data is supplied via the data-in line 705 from input/output ports on the integrated circuit 700 or from other data sources internal or external to the integrated circuit 700, to the data-in structures in block 780.

In the example shown in FIG. 7, data output multiplexers 790 have inputs coupled to the output data lines 785. Output drivers 797 have inputs coupled to outputs of the data output multiplexers 790 via data lines 795. Data output multiplexers 790 select sensed data on the output data lines 785 from one of the memory banks in the memory array 760. Output drivers 797 drive selected sensed data to destinations external to the integrated circuit 700.

For instance, a memory device can have N banks of memory cells and each bank can include 128 columns coupled to 128 output data lines. The data output multiplexers 790 can select data from 128 output data lines of one memory bank, and the output drivers 797 can output data from some of the 128 output data lines.

In the example shown in FIG. 7, a controller 710 includes logic to sense voltages on the sending node in the integrated circuit 700. The logic includes, during a first interval, turning on the charge circuits (e.g. M2, FIG. 2), and setting clamp signals (e.g. BLCLAMP, FIG. 5) to set the plurality of bit lines to a first level $V_{PRE}$. The logic includes, during a second interval, enabling current flow through selected memory cells on the plurality of bit lines to the reference line or to reference lines coupled to a reference voltage, so that current through the memory cells discharges the bit lines at rates that depend on the thresholds of the memory cells, while setting the clamp voltage at a second level $V_{KEEP}+V_T$. The logic includes preventing a voltage change as a result of the current flow on the bit lines from causing a bit line voltage to pass outside a range between the first level $V_{PRE}$ and a second level $V_{KEEP}$. The second level $V_{KEEP}$ is lower than the first level $V_{PRE}$ and higher than a reference voltage. The logic includes, during a third interval, turning off the charge circuits, and setting the clamp voltage at a third level $V_{SEN}+V_T$ to block current flow to the sensing nodes from the bit lines having voltage above a third level, and to pass current from the bit lines having a voltage level below the third level to the sensing nodes. The logic includes, during a fourth interval, sensing voltages on the sensing nodes while blocking current flow on the bit lines, where the voltages on the sensing nodes are higher than the reference voltage.

The controller 710 using a bias arrangement state machine controls the application of bias arrangement supply voltage generated or provided through the voltage supply or supplies in block 720, such as read and program voltages. The controller 710 can be implemented using special-purpose logic circuitry as known in the art. In alternative embodiments, the controller comprises a general-purpose processor, which can be implemented on the same integrated circuit, which executes a computer program to control the operations of the device. In yet other embodiments, a combination of special-purpose logic circuitry and a general-purpose processor can be utilized for implementation of the controller.

In general, the embodiments of methods and devices described herein for improving reading speed on output data lines of sense amplifiers can be applied to bit lines and data lines placed closely together in integrated circuits for other functions.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for sensing data in a memory device, the memory device comprising a block of memory cells coupled to a plurality of bit lines, the method comprising:
   precharging the plurality of bit lines to a first level $V_{PRE}$;
   enabling current flow through selected memory cells on the plurality of bit lines to at least one reference line coupled to a reference voltage;
   preventing a voltage on the bit lines from passing outside a range between the first level and a second level $V_{KEEP}$, the second level being lower than the first level and higher than the reference voltage; and
   sensing data in the selected memory cells.

2. The method of claim 1, wherein said enabling includes applying a bias to a selected word line in a plurality of word lines and coupled to a selected memory cell in the block of memory cells, subsequent to said precharging.

3. The method of claim 1, including using clamp circuits coupled to the bit lines, to limit the voltage on the bit lines at the second level $V_{KEEP}$.

4. The method of claim 1, wherein said sensing includes:
   turning off the precharging;
   blocking current flow to sensing nodes coupled to the selected memory cells from the bit lines having voltage above a third level; and
   passing current from the bit lines having a voltage level below the third level to the sensing nodes.

5. The method of claim 4, further comprising blocking current flow on the bit lines while sensing voltages on the sensing nodes.

6. The method of claim 4, wherein said sensing includes determining whether voltages on the sensing nodes are above or below a trip point near the third level.

7. The method of claim 1, further comprising discharging bit lines in the plurality of bit lines to the reference voltage prior to the step of precharging.

8. A method for sensing data in a memory device, the memory device comprising a block of memory cells having a plurality of strings coupled between bit lines and reference lines, the method comprising:
   applying a read bias to a selected word line in a plurality of word lines, and a reference voltage to a source side of the plurality of strings;
   integrating current on the bit lines for a reading interval to establish a sensing voltage on the bit lines;
   limiting the sensing voltage to a range above a minimum level ($V_{KEEP}$) during said integrating, the minimum level being greater than the reference voltage; and
   sensing the sensing voltages.

9. The method of claim 8, including prior to said integrating, precharging the bit lines to a precharge voltage, and wherein said integrating includes discharging the bit lines at a rate that depends on threshold voltages of memory cells on the selected word line.

10. The method of claim 8, including limiting the sensing voltage by applying a charge voltage to sensing nodes above the sensing voltage, and clamping the bit lines using bit line clamp circuits between the bit lines and the sensing nodes set for clamping at the minimum level, whereby current flow is blocked between the bit lines and the sensing nodes if the sensing voltage is above the minimum level, and current flow is enabled between the bit lines and the sensing nodes if the sensing voltage is below the minimum level.

11. The method of claim 10, including coupling the bit lines to the sensing nodes using the bit line clamp circuits set to block current flow if the sensing voltage on the bit line is above a sensing level ($V_{SEN}$) and to pass current to the sensing node if the sensing voltage is below the sensing level.

12. A memory device, comprising:
   a block of memory cells coupled to a plurality of bit lines;
   at least one reference line coupled to the plurality of bit lines in the block, wherein a memory cell in the block of memory cells includes a drain terminal coupled to a bit line in the plurality of bit lines, and a source terminal coupled to the reference line;
   charge circuits to apply a precharge voltage to sensing nodes coupled to the bit lines;
   sense amplifiers coupled to the sensing nodes; and
   a controller for setting the plurality of bit lines to a first level $V_{PRE}$, and for preventing a voltage on the bit lines from passing outside a range between the first level and a second level $V_{KEEP}$ when enabling a current flow through selected memory cells on the plurality of bit lines to the at least one reference line coupled to a reference voltage, the second level $V_{KEEP}$ being lower than the first level and higher than the reference voltage.

13. The memory device of claim 12, wherein said enabling includes applying a bias to a selected word line in a plurality of word lines and coupled to a selected memory cell in the block of memory cells, subsequent to setting the plurality of bit lines to the first level $V_{PRE}$.

14. The memory device of claim 12, including clamp circuits, between the sensing nodes and the bit lines in the plurality of bit lines, the clamp circuits being responsive to clamp voltages, the controller being configured to use the clamp circuits to limit the voltage change at the second level $V_{KEEP}$.

15. The memory device of claim 12, wherein said controller is further configured to:
   turn off the charge circuits; and
   set the clamp voltage at a third level $V_{SEN}+V_T$ to block current flow to the sensing nodes from the bit lines having voltage above a third level, and to pass current from the bit lines having a voltage level below the third level to the sensing nodes.

16. The memory device of claim 12, the controller being configured to block current flow on the bit lines while sensing voltages on the sensing nodes.

17. The memory device of claim 15, the sense amplifiers being configured to determine whether voltages on the sensing nodes are above or below a trip point near the third level.

18. The memory device of claim 12, the controller being configured to discharge bit lines in the plurality of bit lines to the reference voltage prior to turning on the charge circuits.

* * * * *